(12) United States Patent
Bilac

(10) Patent No.: US 7,787,223 B2
(45) Date of Patent: Aug. 31, 2010

(54) ELECTRONIC BREAKER SYSTEM

(75) Inventor: Mario Bilac, Lawrenceville, GA (US)

(73) Assignee: Siemens Industry, Inc., Alpharetta, GA (US)

( * ) Notice: Subject to any disclaimer, the term of this patent is extended or adjusted under 35 U.S.C. 154(b) by 285 days.

(21) Appl. No.: 11/873,469

(22) Filed: Oct. 17, 2007

(65) Prior Publication Data
US 2008/0212244 A1 Sep. 4, 2008

Related U.S. Application Data

(60) Provisional application No. 60/852,869, filed on Oct. 19, 2006.

(51) Int. Cl.
*H02H 3/00* (2006.01)
*H02H 3/08* (2006.01)

(52) U.S. Cl. ........................................ 361/42; 361/93.1

(58) Field of Classification Search .................. 361/42, 361/86, 64
See application file for complete search history.

(56) References Cited

U.S. PATENT DOCUMENTS

| | | | |
|---|---|---|---|
| 4,458,225 A * | 7/1984 | Forsell | 335/35 |
| 4,672,501 A | 6/1987 | Bilac | |
| 4,694,373 A | 9/1987 | Demeyer | |
| 6,239,960 B1 * | 5/2001 | Martin | 361/86 |
| 6,985,784 B2 * | 1/2006 | Vandevanter et al. | 700/95 |
| 2003/0169544 A1 * | 9/2003 | Langford et al. | 361/42 |
| 2006/0049694 A1 * | 3/2006 | Kates | 307/132 E |
| 2006/0193096 A1 * | 8/2006 | Colombo et al. | 361/86 |
| 2006/0238932 A1 | 10/2006 | Cowan et al. | |

FOREIGN PATENT DOCUMENTS

| DE | 19516559 A1 | 11/1995 |
|---|---|---|
| GB | 2392029 A | 2/2004 |

* cited by examiner

*Primary Examiner*—Stephen W Jackson
*Assistant Examiner*—Angela Brooks
(74) *Attorney, Agent, or Firm*—Jose de la Rosa

(57) ABSTRACT

A system, method, and device for a circuit breaker used in residential and commercial panels are disclosed. The exemplary circuit may have an overload protection device causing a disruption in a circuit when the circuit is overloaded. One or more sensors may detect a condition of the circuit and transmit a signal associated the detected condition to an integrated circuit via sensor ports. The integrated circuit may cause a disruption in a circuit when the signal of the detected condition is out of predetermine limit. The integrated circuit may also determine if a sensor is coupled to a sensor port.

16 Claims, 5 Drawing Sheets

302 Couple one or more sensors to one or more sensor ports of a monitoring circuit of the circuit break

304 Determine if a sensor of the one or more sensors is coupled to a sensor port of the one or more sensor ports

306 Determine if a signal from the sensor is within predetermine limits

308 Disrupt a circuit when the signal is out of predetermine limits

310 Reset the monitoring circuit to determine if a sensor of the one or more sensors is coupled to a sensor port Interrupter Device
500

ELECTRONIC BREAKER SYSTEM

CROSS REFERENCE TO RELATED APPLICATIONS

This application is claims priority to U.S. Provisional Patent Application No. 60/852,869 filed Oct. 19, 2006 entitled Residential Electronic Breaker System, which is incorporated fully herein by reference.

TECHNICAL FIELD

The present invention relates to circuit breakers and more particularly, to a device, method, and system for an electronic interrupter circuit breaker.

BACKGROUND INFORMATION

Circuit breakers often include a contact arm operating mechanism mechanically coupled with at least one contact arm and associated contact or a cross-bar assembly connected to the contact arms of a multi-phase circuit breaker. A trip apparatus (e.g., overload solenoid) often includes a moveable core (e.g., a plunger, a pivoting actuator arm, overload relay, or bimetal trip arrangement.) Generally, when a circuit breaker or other switch is in an overload, fault, error or other trip condition, the set of contacts is opened or the switch is otherwise open circuited when the trip apparatus activates the contact arm operating mechanism to open the contacts of the circuit breaker.

Conventional circuit breakers often utilize a bimetal trip arrangement to open the circuit breaker in response to a trip condition. The bimetal element is normally coupled in series with the load and the circuit breaker contacts. The bimetal element is heated by current applied to the load coupled to the circuit breaker. Accordingly, when the current applied to the load exceeds a certain threshold which indicates a trip condition, the bimetal element deforms and activates the contact arm operating mechanism, thereby directly disconnecting power to the load. Alternatively, the bimetal element may be utilized with a solenoid and disconnect current to the coil in response to the trip condition, thereby causing the circuit breaker to disconnect power to the load.

Another type of overload trip apparatus includes a normally closed overload relay coupled in series with the circuit breaker. The overload relay is generally controlled by an integrated circuit controller which monitors the current flowing through the circuit breaker and energizes the coil in the overload relay in response to the trip condition. Alternatively, the integrated circuit controller may be utilized to control a magnetic latch or an electromagnetic plunger control system. The integrated circuit controller can be configured to sense a variety of trip conditions. Based upon samples of the values of the current being applied to the load which is controlled by the switch, the integrated circuit de-energizes the coil in response to the trip condition. Other integrated circuit systems may also include additional sensors and interrupters. The integrated circuit compares the sensed values with predetermined limits and causes the switch to open de-energizing the circuit when predetermined limits are exceeded.

A Ground Fault Circuit Interrupter (GFCI) may be implemented in conjunction with the breaker integrated circuit. A GFCI measures the current flowing through the hot wire and the neutral wire. If the current differs by more than a few milliamps, the current is assumed to be leaking to ground via some other path. This may be because of a short circuit. The short circuit may cause an appliance to become charged or to be leaking to the ground lead, or through a person. The GFCI trips or interrupts the circuit, opening the circuit and preventing a possible hazardous situation.

An Arc Fault Circuit Interrupter (AFCI) may also be implemented in conjunction with the breaker integrated circuit. A large percentage of the fires that occur in residential dwellings can be attributed to "arcing faults." An arc fault is an unintentional electrical discharge characterized by low and erratic current that may ignite combustible materials. The arc-fault detection circuitry detects specific arcs that are determined to be likely to cause a fire. The AFCI uses electronics to recognize the current and voltage characteristics of the arcing faults, and interrupts the circuit when the fault occurs.

Other integrated circuit systems may also include, for example, temperature sensors or other sensor for determining possible hazardous situation. The addition of multiple sensors may add significant costs to the circuit breakers. Each breaker may require an individually integrated circuit. The various different combination of breaker may need to be inventoried and stock. A specifically designed breaker may prohibit future modification or upgrades. Accordingly, a need exists for a device, method, and system that provides for standardized and/or efficient production and distribution of breakers. In addition, a need exists that provides for easy in installation with a low risk of improper installation that may produce an unprotected hazardous situation.

SUMMARY

The present invention is a novel device, system, and method for providing a circuit breaker operation for residential and commercial use. The exemplary method may involve coupling one or more sensors to one or more sensor ports of an integrated circuit of the circuit break. The integrated circuit may determine if a sensor of the one or more sensors is coupled to a sensor port of the one or more sensor ports. The method determines if a signal from the sensor is within predetermine limits when the sensor is determined to be coupled to the sensor port. The method disrupts a circuit when the signal is out of predetermine limits.

The invention may include the following embodiments. The method may detect an overload circuit condition with an overload protection sensors and the integrated circuit disrupting a circuit when the overload circuit condition is detected. In another embodiment, the method detects an overload circuit condition with an over overload protection device having a bimetal mechanical switch device. In another embodiment, the one or more sensors may be a Ground Fault Current Interrupter (GFCI), an Arc Fault Current Interrupter (AFCI), or Differential Fault Current Interrupter (DFCI). In yet another embodiment, the method resets the integrated circuit to determine if a sensor of the one or more sensors is coupled to a sensor port of the one or more sensor ports by resetting the power supply to the circuit breaker. In another embodiment, coupling a sensor of the one or more sensors to a sensor port of the one or more sensor ports reset the integrated circuit.

It is important to note that the present invention is not intended to be limited to a system or method which must satisfy one or more of any stated objects or features of the invention. It is also important to note that the present invention is not limited to the exemplary embodiments described herein. Modifications and substitutions by one of ordinary skill in the art are considered to be within the scope of the present invention, which is not to be limited except by the following claims.

BRIEF DESCRIPTION OF THE DRAWINGS

These and other features and advantages of the present invention will be better understood by reading the following detailed description, taken together with the drawings herein:

FIG. 3 is a flow chart illustrating a method of circuit breaker operation according to an exemplary circuit breaker operation embodiment 300 of the present invention.

DETAILED DESCRIPTION

The present invention relates to circuit breakers for load center panels in residential and commercial dwellings. Load center panels or circuit breaker panels house circuit breakers used to control individual circuits running throughout the dwelling. The circuit breakers prevent overload conditional in additional to incorporating additional fault interrupters to disrupt the circuit when a hazardous condition is detected. The fault interrupters may include a Ground Fault Current Interrupter (GFCI), an Arc Fault Current Interrupter (AFCI), Differential Fault Current Interrupter (DFCI) as well as other interrupts that may be specific to circuit application or use.

The interrupters may be implemented using dedicated circuitry specific to the circuit fault being detected. The specific circuitry requires separate manufacturing for each circuit breaker combination. An exemplary circuit breaker device, method, and system provide a circuit breaker that allow for standardized and/or efficient production and distribution of breakers. In addition, the circuit breaker provides for easy in installation with a low risk of improper installation that may produce an unprotected hazardous situation.

Figure 1:
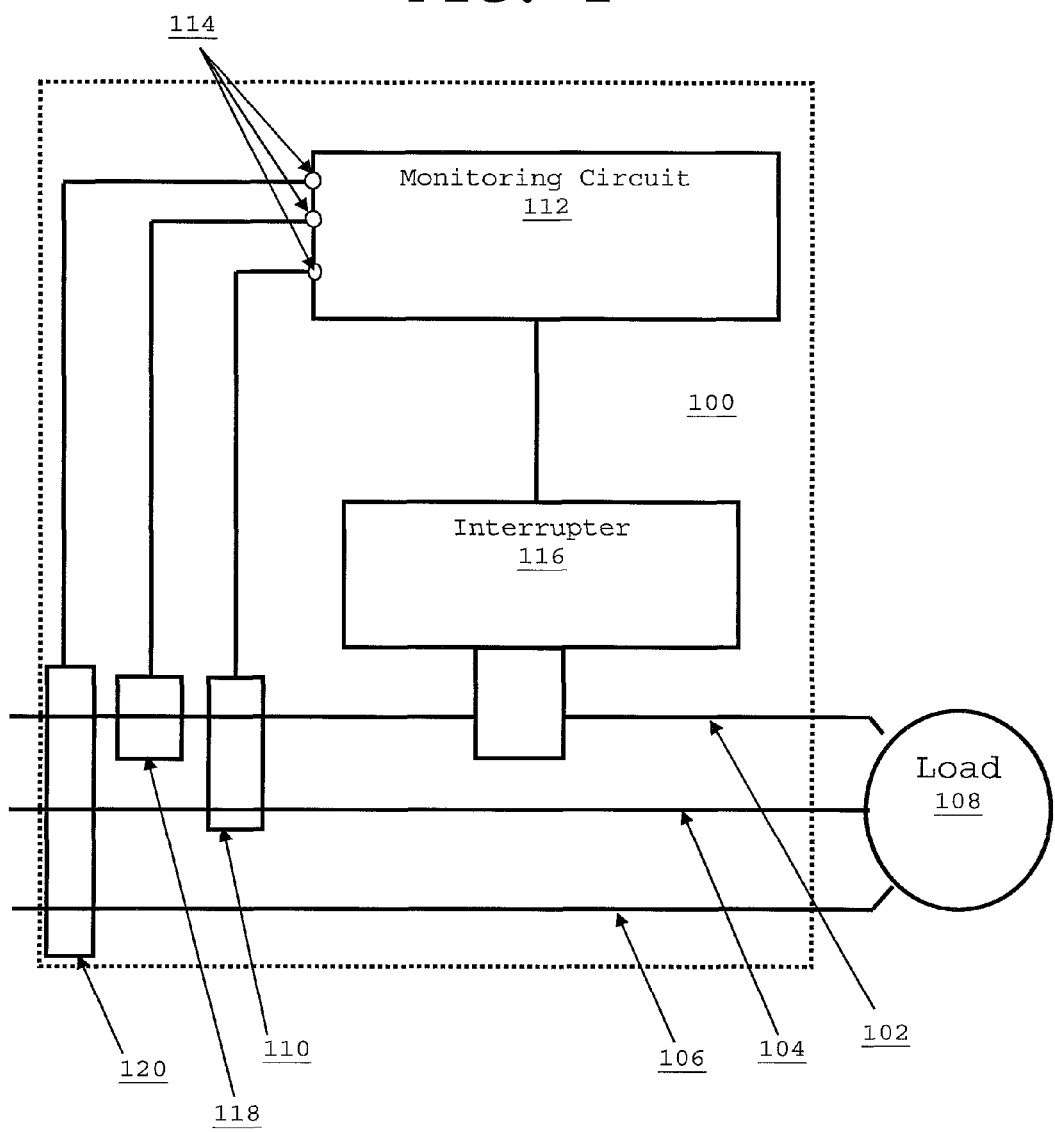
FIG. 1 is a block diagram of a circuit breaker 100 according to the first exemplary circuit breaker embodiment of the present invention.

Referring to FIG. 1, an exemplary circuit breaker 100 may be inserted into a circuit panel. The circuit breaker 100 may couple a hot conduit 102, neutral conduit 104 and/or a ground 106 from a power supply to a load 108. Although the exemplary circuit breaker 100 is described with regard to a single pole, the invention is not limited to a single pole and may be used with two or three pole circuits.

The circuit breaker 100 may include one or more sensors. The sensors may include a ground fault sensor 110 that identifies the current in the hot conduit 102 and neutral conduit 104. The ground fault sensor may determine the current difference between the conduits and transmit a signal of the difference to a monitoring circuit 112 via a sensor port 114.

The monitoring circuit 112 may be an integrated circuit that is designed to handle multiple sensors as will be described later herein. The integrated circuit may be hard-wired configured, programmable configured or a combination thereof. The monitoring circuit 112 may store predetermine limits for each sensor coupled to the sensor ports 114. For example, the monitoring circuit 112 may determine that the signal from the ground fault sensor 110 is not within the predetermine limits identifying a possible hazardous condition is present. The monitoring circuit 112 activates an interrupter 116 that disconnects the hot conduit 102 preventing the flow of current. The interrupter 116 or tripping apparatus may be a variety of known devices used to disconnect conduits, for example solenoid or spring release devices that force the circuit open when directed by the monitoring circuit 112.

In addition, to the ground fault sensor 110 other sensors may be incorporated into the circuit breaker, for example, an arc fault detector 118 and/or differential detector 120. Each detector couples to the monitoring circuit 112 via a sensor port 114. The sensors 118, 120 detect and signal the current condition back to the monitoring circuit 112. The monitoring circuit 112 may compare the current conditions to predetermined limits stored in the monitoring circuit 112. If the current conditions are not in acceptable range, the monitoring circuit 112 triggers the interrupter 116 which opens the circuit until reset.

In another embodiment, the sensors 110, 118, 120 may not send a signal of the current condition back to the monitoring circuit 112 for comparison. The sensors 110, 118, 120 may internal compare the current conditions with limits stored within the sensor and only signal the monitoring circuit 112 when a hazardous condition is detected.

The sensors 110, 118, 120 are not limited to current sensors and may be used to detect a variety of conditions, for example, conduit temperature, voltage or other conditions. The sensors 110, 118, 120 may installed during manufacturing or modified just prior to installation in the circuit breaker panel. According to one embodiment the circuit breaker housing, monitoring circuit 112 and interrupter 116 may be manufactured in a standard fashion regardless of the final combination of sensors. Prior to completion of the manufacturing process individual sensors may be installed and coupled to the sensor ports 114 of the monitoring circuit 112. This allows the circuit breaker 100 to be customized without designing each individual combination of sensors. The monitoring circuit may be configured to automatically detect the presence of a sensor once power is applied to the monitoring circuit 112. The power may be supplied by a transformer from the circuit conduit, as described in greater detail later herein with reference to FIG. 4A. In commercial applications a separate power supply may be used. In addition to automatically detecting a sensor, it is contemplated that jumpers or post circuit programming may used to alert the monitoring circuit 112 of the coupled sensors.

The sensor ports 114 may be specifically configured for a predetermined sensor, for example, a first sensor port may be configured only for arc fault sensors 118. The first sensor port may also include physical couplers that limit coupling to specific sensor in order to prevent incorrect coupling. In another embodiment, the sensor ports may be addressed and configured based on the sensor detected by the monitoring circuit 112. For example, the arc fault sensor may be identified by a specific signal or signal path that indemnifies to the monitoring circuit that an arc fault sensor 118 is coupled to the sensor port and to compare the signal from the arc fault sensor 118 with predetermined limits for an arc fault sensor.

In additional, to installation of sensors 120, 118, 110 during manufacturing the exemplary embodiment may also provide for the addition or modification of the circuit break 100 in the field or immediately prior or after installation. For example a flexible current sensor, described in U.S. Pat. No. 7,230,413 by Zhang et al dated Jun. 12, 2007, incorporated by reference herein, may be coupled to the sensor port 114. The monitoring circuit 112 may detect the flexible current sensor and automatically compare the signal received from the flexible current sensor to predetermined values.

Figure 2:
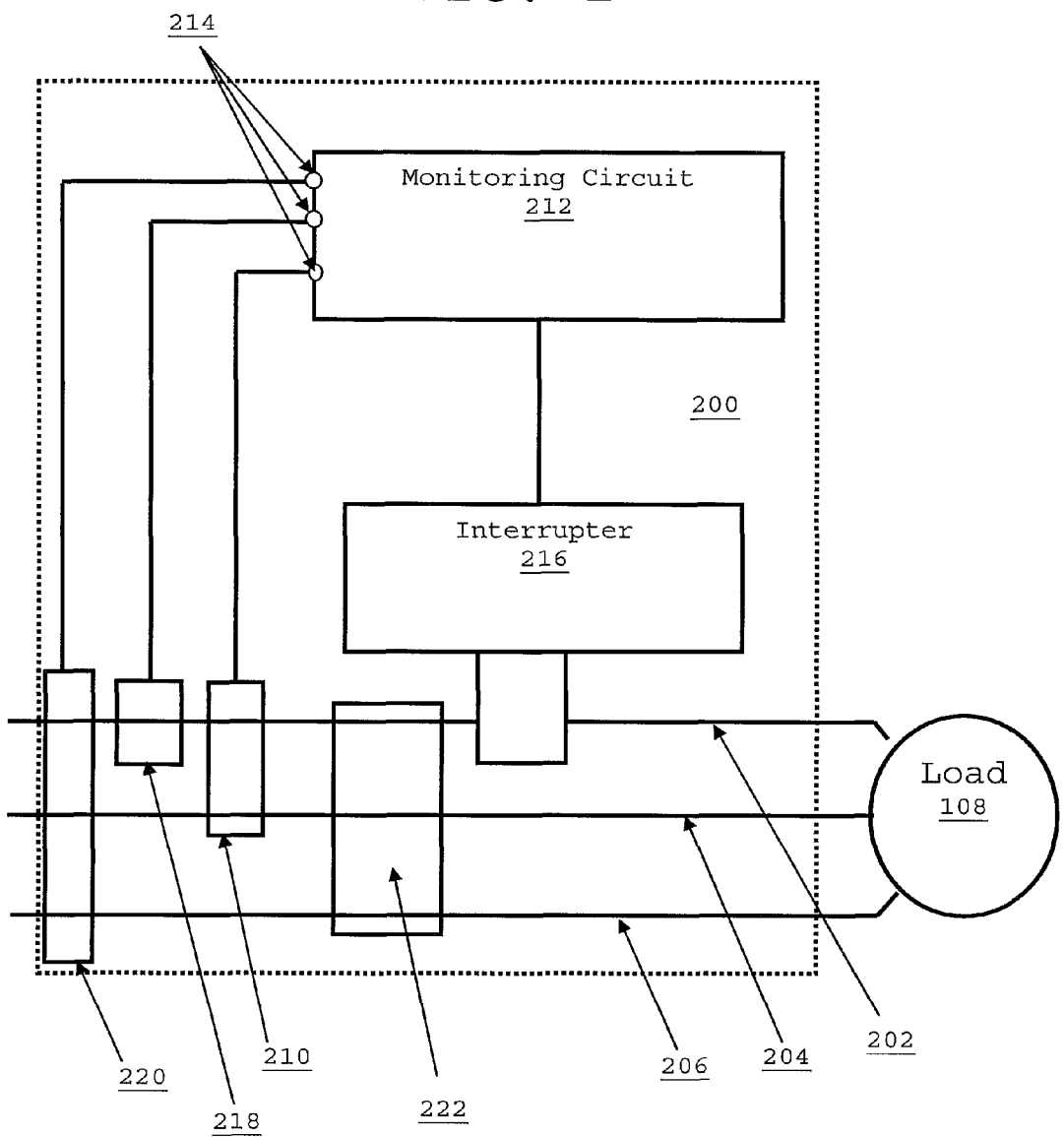
FIG. 2 is a block diagram of a circuit breaker 200 according to the second exemplary circuit breaker embodiment of the present invention.

Referring to FIG. 2, a second exemplary circuit breaker 200 may also include mechanical tripping devices 222. The circuit breaker 200 may couple a hot conduit 202, neutral conduit 204 and/or a ground 206 from an external power supply to a load 208. The circuit breaker 200 may include one or more sensors 210, 218, 220. The sensors may be similar to the sensor described in the first exemplary embodiment. Signals may be transmitted to a monitoring circuit 212 via a sensor port 214 as also previously described in the first exemplary embodiment. The monitoring circuit 212 activates an interrupter 216 that disconnects the hot conduit 202 preventing the flow of current. The mechanical tripping device 222 may be for example a bimetal overload switch that activates when an overload condition is detected. The overload switch may be in addition to an electronic overload sensor of the monitoring circuit 212 providing redundant detection or may compliment the other sensors. The mechanical tripping device 222 may also be incorporated with the interrupter 216 or tripping apparatus. In this example, the combined mechanical tripping device 222 and interrupter 216 may cause a disruption in the circuit when a condition directly triggers the mechanical tripping device 222 or when the monitoring circuit 212 triggers a disruption.

Referring to FIG. 3, an exemplary method for circuit breaker operation 300 is provided. One or more sensors 110, 118, 120 is physically coupled to one or more sensor ports 114 of a monitoring circuit 112 of the circuit break 100 (block 302). The monitoring circuit 112 detects if a sensor 110, 118, 120 is coupled to a sensor port 114 (block 304). As previously discussed, the monitoring circuit 112 may use a variety of methods to detect if a sensor is coupled to the sensor port 114, for example, the presence of resistance or current. The monitoring circuit 112 determines if a signal from the sensor 110, 118, 120 is within predetermine limits (block 306). The interrupter 116 disrupts a circuit 102, 104, 106 when the signal is out of predetermine limits (block 308). The circuit breaker 100 may be reset to allow the monitoring circuit 112 to determine if a sensor 110, 118, 120 is coupled to a sensor port 114 (block 310). The resetting may occur in a variety of manners, for example but not limited to, the action of disconnecting and reconnecting the power to the circuit breaker 100, the activation of a reset switch on the circuit breaker, the coupling of a sensor to the sensor port 114, periodic resetting by the circuit breaker 100, or other method.

Figure 4A:
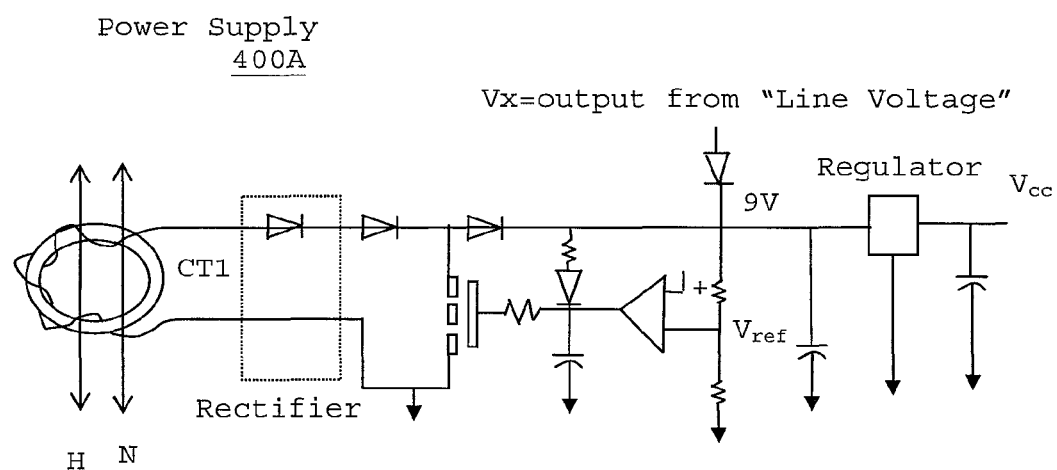
FIGS. 4A-C is a block diagram of a power supply 400A for circuit breaker 200 according to an exemplary power supply embodiment of the present invention.
Figure 4B:
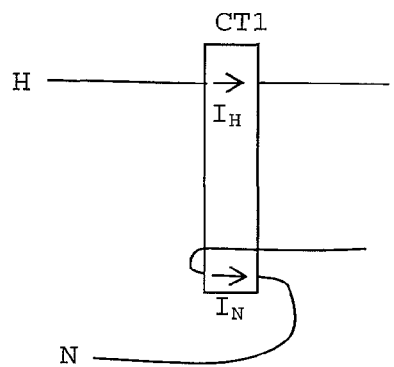
Figure 4C:
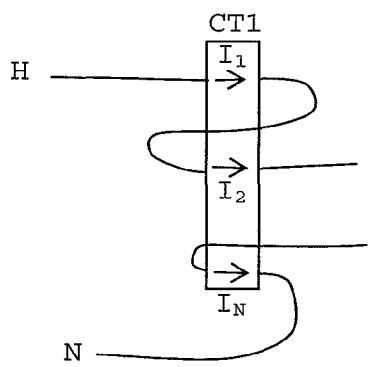

Referring to FIGS. 4A-C, power for the circuit breaker 200 may be transformed from the conduits of the circuit. In order to implement the time-overcurrent curve in microprocessor (firmware) or in hardware (ASIC) of the monitoring circuit 212, the power supply used may be composed of two power supplies that are or'ed together. The first supply uses line voltage as input and the second supply uses line current as the input.

An exemplary topology of the circuit used for the second supply is shown in FIGS. 4A-C. Two methods may be used to the power current transformer. The first method, shown in FIG. 4B, involves increasing or doubling the current through the power current transformer. Providing that the power current equals the hot conduit current plus the neutral conduit current. This decreases the number of secondary turns and decreases the "turn on current with respect to the (1x) circuit breaker current rating. The second method, shown in FIG. 4C, has the same effect and can be obtained by doubling the number of turns of the primary wire. Providing that the power current equals current one plus current two plus the neutral conduit current wherein the hot conduit current equals current one plus current two.

Figure 5:
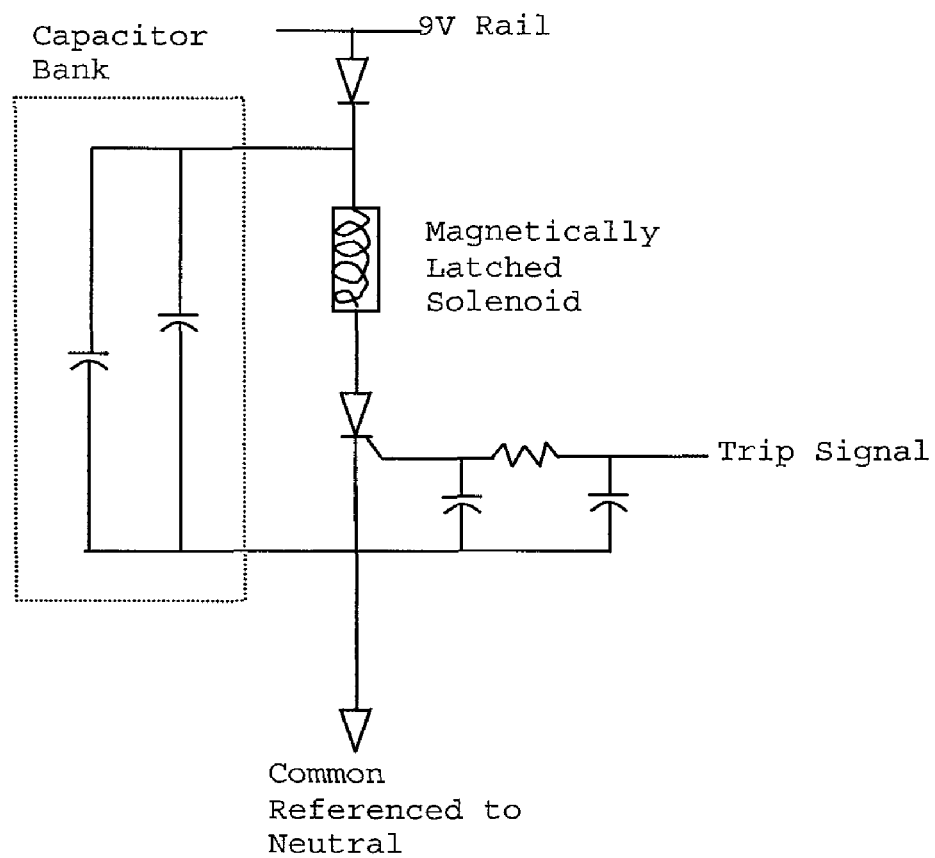
FIG. 5 is a block diagram of an interrupter device 500 for circuit breaker 200 according to an exemplary interrupter device embodiment of the present invention.

The power to the protection circuit is provided by this power supply at about 1x breaker current rating. Thus, for example, if the circuit breaker is rated 15 Amps the unit will need to wake up at 1x breaker current rating. The reason is that during the short circuit current is available for powering the unit and not voltage. During normal operation (below 1x) voltage is available and current is normal but not enough to generate power for the unit. In line voltage power supply generates most all of the power below 1x breaker current rating. For short circuits where the current is 8 xs or higher the voltage may go to very low values, the unit may use a magnetic override which is included in all residential circuit breakers at present and it trips the breaker by opening the contacts. The power supplies do no come in play. During the below magnetic override currents (below 8x) and greater than normal currents (above 1x) the interrupter device 500, as shown in FIG. 5, may be a magnetically latched solenoid which may be powered by the line current power supply.

Persons skilled in the art will appreciate that the present invention can be practiced by other than the described embodiments, which are presented for purposes of illustration rather than of limitation, and the present invention is limited only by the claims that follow.

What is claimed is:

1. A circuit breaker for residential and commercial panels comprising:
   an overload protection device causing a disruption in a circuit when the circuit is overloaded;
   one or more sensors detecting a condition of the circuit;
   one or more sensor ports for receiving a signal associated with the detected condition of the one or more sensors;
   an integrated circuit adapted to operate with a plurality of combinations of sensors, wherein the integrated circuit causes the disruption in the circuit when the signal of the detected condition is out of predetermine limits and wherein the integrated circuit determines a combination of sensors by determining if a sensor of the one or more sensors is coupled to a sensor port of the one or more sensor ports prior to determining if the signal from the sensor is within predetermine limits,
   the circuit breaker comprising at least one of the following:
   (a) resetting a power supply to the circuit breaker resets the integrated circuit determining if a sensor of the one or more sensors is coupled to a sensor port of the one or more sensor ports, and
   (b) coupling a sensor of the one or more sensors to a sensor port of the one or more sensor ports reset the integrated circuit.

2. The circuit breaker of claim 1, wherein the overload protection device is one of the one or more sensors.

3. The circuit breaker of claim 1, wherein the overload protection device is a bimetal mechanical switch device.

4. The circuit breaker of claim 1, wherein the one or more sensors is one of a Ground Fault Current Interrupter (GFCI), an Arc Fault Current Interrupter (AFCI), and Differential Fault Current Interrupter (DFCI).

5. The circuit breaker of claim 1, further comprising:
   one or more mechanical sensors wherein one of the one or more mechanical sensors is one of a Ground Fault Current Interrupter GFCI, an (Arc Fault Current Interrupter AFCI), and Differential Fault Current Interrupter (DFCI).

6. The circuit breaker of claim 1, wherein if a sensor is determined, the integrated circuit configures the sensor port the sensor is coupled to based upon a detected type of the sensor.

7. A method of a circuit breaker operation for residential and commercial panels comprising the acts of:
   coupling one or more sensors to one or more sensor ports of an integrated circuit of the circuit break, wherein the integrated circuit is adapted to operate with a plurality of combinations of sensors;
   determining a combination of sensors by determining if a sensor of the one or more sensors is coupled to a sensor port of the one or more sensor ports of the integrated circuit;
   determining if a signal from the sensor is within predetermine limits when the sensor is determined to be coupled to the sensor port;
   disrupting a circuit when the signal is out of predetermine limits; and
   the method further comprising at least one of:
   (a) resetting the integrated circuit to determine if a sensor of the one or more sensors is coupled to a sensor port of the one or more sensor ports by resetting a power supply to the circuit breaker, and
   (b) coupling a sensor of the one or more sensors to a sensor port of the one or more sensor ports reset the integrated circuit.

8. The method of a circuit breaker operation of claim 7, further comprising the act of:
   detecting an overload circuit condition with an overload protection sensors and the integrated circuit disrupting a circuit when the overload circuit condition is detected.

9. The method of a circuit breaker operation of claim 7, further comprising the act of:
   detecting an overload circuit condition with an over overload protection device having a bimetal mechanical switch device.

10. The method of a circuit breaker operation of claim 7, wherein the one or more sensors is one of a Ground Fault Current Interrupter (GFCI), an Arc Fault Current Interrupter (AFCI), and Differential Fault Current Interrupter (DFCI).

11. The method of a circuit breaker operation of claim 7, further comprising:
    monitoring the circuits conditions with one or more mechanical sensors wherein one of the one or more mechanical sensors is one of a Ground Fault Current Interrupter GFCI, an (Arc Fault Current Interrupter AFCI), and Differential Fault Current Interrupter (DFCI).

12. A circuit breaker for residential and commercial electrical utility circuits comprising:
    an overload protection device causing a disruption in a circuit when the circuit is overloaded;
    one or more fault detector ports for coupling one or more circuit fault detectors to an integrated circuit; and
    the integrated circuit being adapted to operate with a plurality of combinations of detectors, wherein the integrated circuit determines a combination of detectors by determining if a fault detector of the one or more fault detectors is coupled to a fault detector port of the one or more fault detector ports, and causes a disruption to the circuit when one or more of the fault detectors are detected as coupled to the one or more fault detector ports and one or more fault detectors send a signal of a condition out of predetermine limit assigned for the one or more fault detectors,
    wherein resetting the power supply to the circuit breaker resets the integrated circuit determining if one or more of the circuit fault detectors are coupled to the one or more fault detector ports.

13. The circuit breaker of claim 12, wherein the overload protection device is one of one or more sensors.

14. The circuit breaker of claim 12, wherein the overload protection device is a bimetal mechanical switch device.

15. The circuit breaker of claim 12, wherein the one or more circuit fault detectors are one of a Ground Fault Current Interrupter (GFCI), an Arc Fault Current Interrupter (AFCI), and Differential Fault Current Interrupter (DFCI).

16. The circuit breaker of claim 12, wherein the circuit breaker is one of a single pole, two pole, and three pole breaker.

* * * * *